US012622154B2

(12) United States Patent
Pang et al.

(10) Patent No.: US 12,622,154 B2
(45) Date of Patent: May 5, 2026

(54) DISPLAY DEVICE

(71) Applicant: LG Display Co., Ltd., Seoul (KR)

(72) Inventors: HeeSuk Pang, Paju-si (KR); MinJoo Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 441 days.

(21) Appl. No.: 18/370,179

(22) Filed: Sep. 19, 2023

(65) Prior Publication Data

US 2024/0224707 A1    Jul. 4, 2024

(30) Foreign Application Priority Data

Dec. 30, 2022    (KR) .......................... 10-2022-0190514

(51) Int. Cl.
*H10K 59/80*      (2023.01)
*H10K 59/122*     (2023.01)

(52) U.S. Cl.
CPC ..... *H10K 59/80517* (2023.02); *H10K 59/122* (2023.02)

(58) Field of Classification Search
CPC ........................ H10K 59/80517; H10K 59/122
See application file for complete search history.

(56) References Cited

U.S. PATENT DOCUMENTS 7,667,397 B2    2/2010  Oh et al.
7,948,176 B2    5/2011  Oh et al.

2013/0140543 A1*   6/2013  Harada ................ H10K 59/122
                                                      257/40
2016/0322454 A1    11/2016  Zhang et al.
2022/0029021 A1    1/2022  Kim et al.
2022/0209185 A1    6/2022  Kim et al.
2025/0318363 A1*   10/2025  Lee ...................... H10K 59/122

FOREIGN PATENT DOCUMENTS

CN         114864645 A      8/2022
TW         M529277 U        9/2016

OTHER PUBLICATIONS

Notice of Allowance issued Jun. 14, 2024 for Taiwanese Patent Application No. 112133243.
Combined Search and Examination Report issued on Jan. 25, 2024, in connection with the counterpart GB Application No. 2311288.1.

* cited by examiner

*Primary Examiner* — Joseph L Williams
(74) *Attorney, Agent, or Firm* — Morgan, Lewis & Bockius LLP

(57) ABSTRACT

A display device includes a sub-electrode layer disposed on the substrate while corresponding to at least a part of the non-display area; and banks disposed on the planarization layer in the display area so as to expose at least a part of the anode and disposed on the sub-electrode layer in the non-display area, in which the bank includes a plurality of bank opening portions disposed in the non-display area so as to expose at least a part of the sub-electrode layer, and in which the sub-electrode layer includes oxygen vacancies in an area in which the sub-electrode layer overlaps the plurality of bank opening portions. Therefore, the display device according to the present disclosure, it is possible to provide the display device capable of implementing excellent reliability by suppressing degradation of the pixel caused by oxygen.

21 Claims, 9 Drawing Sheets

<u>100</u>

DISPLAY DEVICE

CROSS-REFERENCE TO RELATED APPLICATIONS

This application claims the priority of Korean Patent Application No. 10-2022-0190514 filed on Dec. 30, 2022, in the Korean Intellectual Property Office, the disclosure of which is incorporated herein by reference.

BACKGROUND

Technical Field

The present disclosure relates to a display device, and more particularly, to a display device capable of suppressing degradation caused by oxygen introduced from the outside.

Discussion of the Related Art

Recently, a display field for visually expressing electrical information signals has been rapidly developed as the information age has come in earnest. Therefore, various display devices, which are thin in thickness and light in weight and have excellent performances such as low power consumption, have been developed. Examples of the display devices may include a liquid crystal display device (LCD), an organic light-emitting display device (OLED), and the like.

An organic light-emitting display device refers to a display device that autonomously emits light. Unlike a liquid crystal display device, the organic light-emitting display device does not require a separate light source and thus may be manufactured as a lightweight, thin display device. In addition, the organic light-emitting display device is advantageous in terms of power consumption because the organic light-emitting display device operates at a low voltage. Further, the organic light-emitting display device is studied as a next-generation display device because the organic light-emitting display device is excellent in color implementation, a response speed, a viewing angle, and a contrast ratio (CR).

In response to market demands for organic light-emitting display devices that are lightweight and thin, the display devices are becoming gradually slimmer, and there is an increasing need to decrease a bezel area (non-display area).

Meanwhile, the organic light-emitting display device requires a minimum bezel distance to ensure reliability against outside air such as oxygen, and the minimum bezel distance may be referred to as a reliability bezel. The reliability bezel may be defined as a distance from an end of a substrate to an end of a cathode.

As described above, as a need for a slimmer non-display area increases to meet a need for a slimmer display device, the assurance of reliability against outside air is considered as an important issue.

SUMMARY

When oxygen is introduced through a non-display area of a display device, the oxygen comes into contact with a cathode in a display area through a fine pinhole present in the cathode or through a seam portion formed by foreign materials. For this reason, when the cathode is oxidized, a dark spot occurs, and the dark spot becomes a dead pixel as time passes, which degrades display quality.

Accordingly, embodiments of the present disclosure are directed to a display device that substantially obviates one or more of the problems due to limitations and disadvantages of the related art.

An aspect of the present disclosure is to provide a display device capable of suppressing or delaying penetration of oxygen, which is introduced from the outside, into a display area, thereby minimizing degradation of a pixel caused by oxygen.

Another aspect of the present disclosure is to provide a display device capable of implementing excellent reliability by suppressing degradation of a pixel caused by oxygen without greatly increasing the number of process steps or costs.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises: a substrate having a display area and a non-display area configured to surround the display area; a thin-film transistor disposed on the substrate while corresponding to the display area; a planarization layer disposed to cover the thin-film transistor; an organic light-emitting element disposed on the planarization layer while corresponding to the display area and including an anode electrically connected to the thin-film transistor, an organic light-emitting layer disposed on the anode, and a cathode disposed on the organic light-emitting layer; a sub-electrode layer disposed on the substrate while corresponding to at least a part of the non-display area; and banks disposed on the planarization layer in the display area so as to expose at least a part of the anode and disposed on the sub-electrode layer in the non-display area, in which the bank includes a plurality of bank opening portions disposed in the non-display area so as to expose at least a part of the sub-electrode layer, and in which the sub-electrode layer includes oxygen vacancies in an area in which the sub-electrode layer overlaps the plurality of bank opening portions.

Other detailed matters of the exemplary embodiments are included in the detailed description and the drawings.

The display device according to the present disclosure includes the oxygen vacancies in at least a part of the sub-electrode layer in the non-display area, which suppresses or delays the penetration of oxygen, which is introduced from the outside, into the display area. Therefore, it is possible to minimize degradation of the pixel caused by oxygen introduced through the non-display area.

In addition, according to the display device according to the present disclosure, the sub-electrode layer may be made of the same material and made by the same process as the anode of the display area. Therefore, it is possible to provide the display device capable of implementing excellent reliability by suppressing degradation of the pixel caused by oxygen without greatly increasing the number of process steps or costs.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
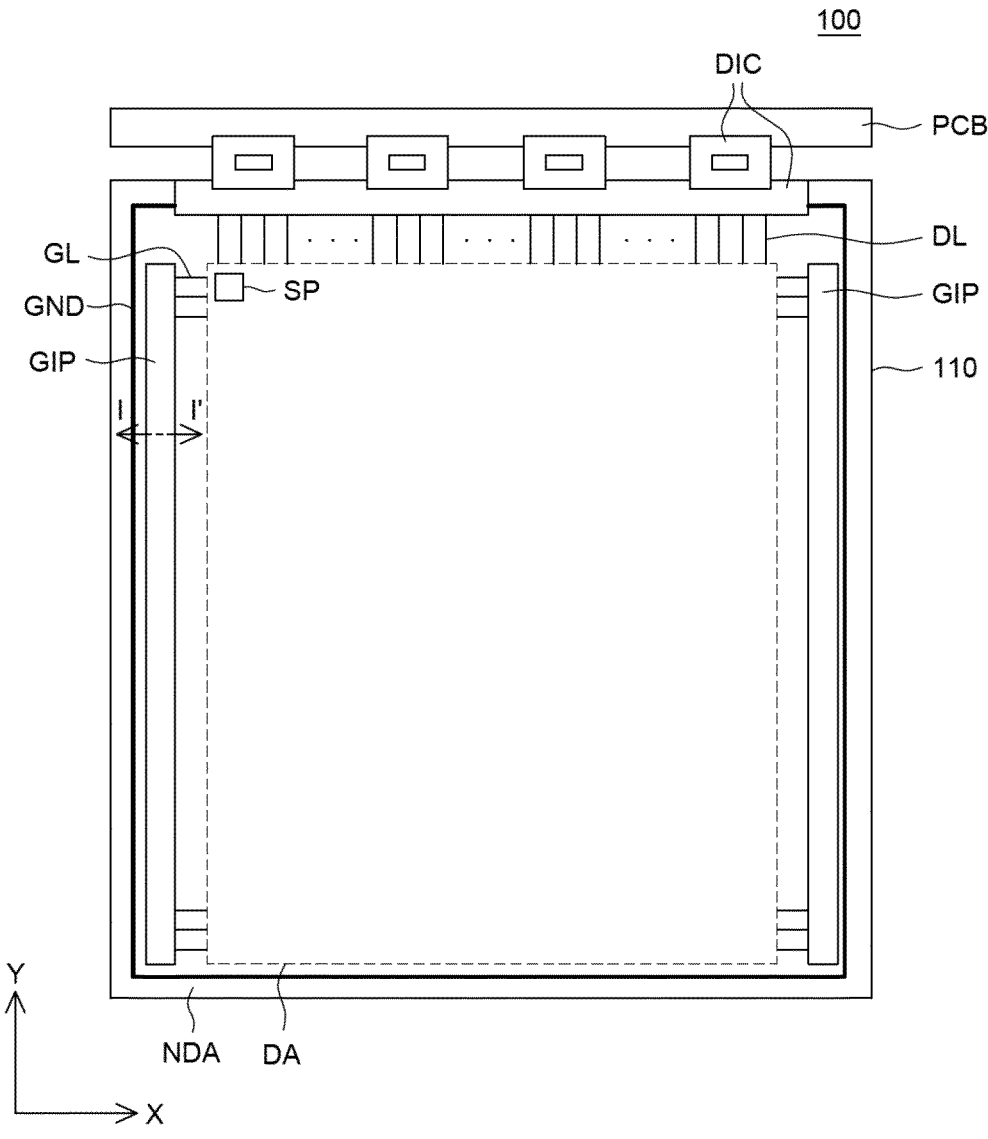
FIG. 1 is a top plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
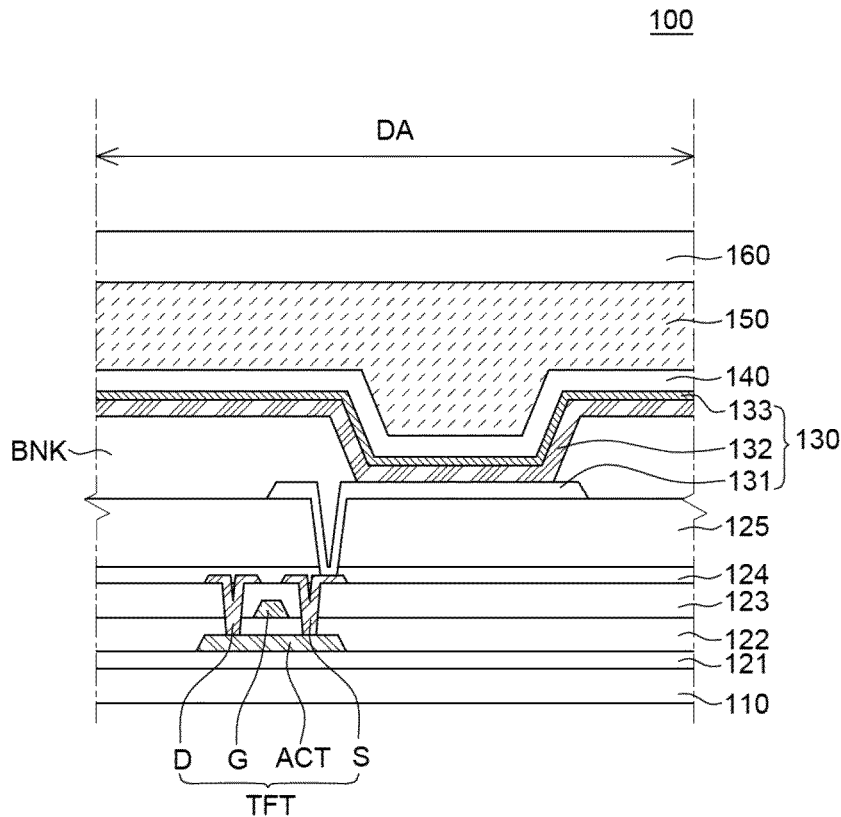
FIG. 2 is a cross-sectional view illustrating one subpixel of the display device according to the exemplary embodiment of the present disclosure.
Figure 3:
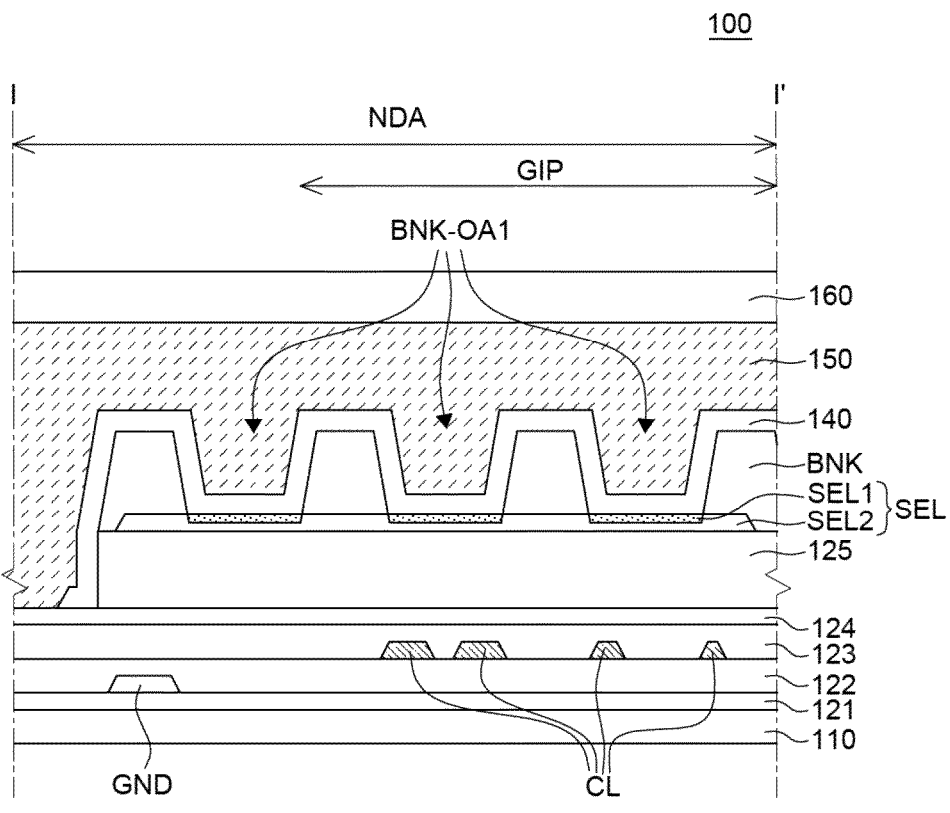
FIG. 3 is a cross-sectional view taken along line I-I' in FIG. 1.

FIG. 1 is a top plan view of a display device according to an exemplary embodiment of the present disclosure, FIG. 2 is a cross-sectional view illustrating one subpixel of the display device according to the exemplary embodiment of the present disclosure, and FIG. 3 is a cross-sectional view taken along line I-I' in FIG. 1.

With reference to FIGS. 1 to 3, a display device 100 according to an exemplary embodiment of the present disclosure includes a substrate 110, a thin-film transistor TFT, a planarization layer 125, an organic light-emitting element 130, a sub-electrode layer SEL, gate drive parts GIP, a bank BNK, a sealing layer 140, a bonding layer 150, and a sealing substrate 160.

The substrate 110 includes areas defined as a display area DA and a non-display area NDA. The display area DA is an area including a plurality of subpixels SP and configured to display an image. The non-display area NDA is an area that does not display an image.

The plurality of subpixels SP is disposed in the display area DA. The plurality of subpixels SP is defined by a plurality of data lines DL and a plurality of gate lines GL that intersect one another. The plurality of subpixels SP is connected to the plurality of data lines DL and the plurality of gate lines GL. The subpixel SP is an element for displaying one color. The subpixels SP may each be configured to emit any one of red light, green light, blue light, and white light. However, the present disclosure is not limited thereto.

Various lines, a drive circuit, a printed circuit board, and the like may be disposed in the non-display area NDA to operate the subpixel SP and a subpixel circuit disposed in the display area DA. The non-display area NDA surrounds four sides of the display area DA. The non-display area NDA includes first and second sides parallel to each other and each extending in a first direction, and third and fourth sides parallel to each other and each extending in a second direction. For example, the first direction may be a Y-axis direction, and a second direction may be an X-axis direction. However, the present disclosure is not limited thereto.

For example, the gate drive parts GIP and data drive parts DIC may be disposed in the non-display area NDA. The gate drive parts GIP may be respectively disposed on the first and second sides of the non-display area NDA. The data drive part DIC may be disposed on the third side of the non-display area NDA. The fourth side may be a non-pad part on which the gate drive part GIP or the data drive part DIC is not disposed. However, the present disclosure is not limited thereto. The positions of the gate drive part GIP, the data drive part DIC, and the non-pad part may be changed, as necessary. FIG. 1 illustrates that the gate drive parts GIP are respectively disposed on the first and second sides. However, the present disclosure is not limited thereto. The gate drive part GIP may be disposed only on any one of the first and second sides in accordance with operation methods or design.

The data drive part DIC is connected to each of the plurality of data lines DL and supplies a data voltage. The data drive part DIC includes at least one data drive IC. The data drive IC may be connected to the data line DL in a COF (chip on film) manner or a TAB (tape automated bonding) manner. FIG. 1 illustrates the COF (chip on film) type in which the data drive IC is mounted on a flexible film, one end of the flexible film is bonded to the printed circuit board PCB, and the other end of the flexible film is bonded to a data drive IC pad part on the substrate 110. However, the present disclosure is not limited thereto.

The gate drive part GIP is connected to each of the plurality of gate lines GL and outputs a gate signal. When the gate signal is supplied to the gate line GL, the data voltage may be applied to the subpixel SP connected to the particular gate line GL. The gate drive part GIP is connected to the gate line in a gate-in-panel manner, in which the gate drive IC is formed directly on the non-display area NDA of the substrate 110.

A ground line GND may be further disposed in the non-display area NDA. The ground line GND may be disposed on the three sides of the non-display area NDA. Specifically, the ground line GND may be disposed along the first side, the fourth side, and the second side of the non-display area NDA. FIG. 1 illustrates that the ground line GND is disposed outside the gate drive part GIP. However, the present disclosure is not limited thereto.

The substrate 110 is a substrate for supporting various elements for operating the display device 100. The substrate 110 may be configured as a material excellent in insulation performance and moisture penetration resistance. For example, the substrate 110 may be a glass substrate or a plastic substrate. However, the present disclosure is not limited thereto. For example, the plastic substrate may be made of a material selected from polyethylene phthalate, polyimide, polyamide, polycarbonate, and the like. However, the present disclosure is not limited thereto.

A plurality of thin-film transistors TFT and a plurality of organic light-emitting elements 130 may be disposed in the display area DA of the substrate 110. The thin-film transistor TFT and the organic light-emitting element 130 may be disposed on each of the plurality of subpixels SP.

A buffer layer 121 may be formed on the substrate 110 before the thin-film transistor TFT is formed. The buffer layer 121 improves a bonding force between the substrate 110 and an active layer ACT or various conductive material layers. In addition, the buffer layer 121 may block foreign materials on an upper portion of the substrate 110 from the outside or block moisture or the like introduced from the outside. The buffer layer 121 may be configured as a single layer or a multilayer, as necessary. For example, the buffer layer 121 may be made of an inorganic material such as silicon oxide, silicon nitride, or silicon oxynitride. However, the present disclosure is not limited thereto. The buffer layer 121 may extend to the non-display area NDA.

The thin-film transistor TFT may be disposed on the buffer layer 121. For convenience, the drawing illustrates only the drive thin-film transistor among various thin-film transistors that may be included in the display device 100. However, a switching thin-film transistor, a capacitor, and the like may be included.

The thin-film transistor TFT is an element for operating the organic light-emitting element 130 disposed in the display area DA. The thin-film transistor TFT includes a gate electrode G, the active layer ACT, a source electrode S, and a drain electrode D. The active layer ACT may be disposed on the buffer layer 121. The active layer ACT may be made of a metal oxide semiconductor, amorphous silicon, or low-temperature polycrystalline silicon. However, the present disclosure is not limited thereto. A gate insulating layer 122 is disposed on the active layer ACT. For example, the gate insulating layer 122 may be made of an inorganic material such as silicon oxide, silicon nitride, or silicon oxynitride. However, the present disclosure is not limited thereto. In addition, the gate insulating layer 122 may be configured as a single layer or a multilayer. The gate electrode G is disposed on the gate insulating layer 122. An interlayer insulating layer 123 is disposed on the gate electrode G to cover the gate electrode G. For example, the interlayer insulating layer 123 may be made of an inorganic material such as silicon oxide, silicon nitride, or silicon oxynitride. However, the present disclosure is not limited thereto. In addition, the interlayer insulating layer 123 may be configured as a single layer or a multilayer. The source electrode S and the drain electrode D are disposed on the interlayer insulating layer 123 and connected to the active layer ACT by a contact hole formed through the gate insulating layer 122 and the interlayer insulating layer 123. However, the present disclosure is not limited thereto. The structure of the thin-film transistor TFT may be variously changed in accordance with operation methods or design. The gate insulating layer 122 and the interlayer insulating layer 123 may extend to the non-display area NDA.

A protective layer 124 is disposed to cover the thin-film transistor TFT. The protective layer 124 may include a contact hole so that the source electrode S or the drain electrode D of the thin-film transistor TFT may be electrically connected to the organic light-emitting element 130. For example, the protective layer 124 may be made of an inorganic material such as silicon oxide, silicon nitride, or silicon oxynitride. However, the present disclosure is not limited thereto. The protective layer 124 may extend to the non-display area NDA.

The drawing illustrates that the gate insulating layer 122, the interlayer insulating layer 123, and the protective layer 124 each provide a flat surface. However, the present disclosure is not limited thereto. In accordance with process methods or design, the gate insulating layer 122, the interlayer insulating layer 123, and the protective layer 124 may each be formed as a conformal thin-film having a predetermined thickness regardless of a shape of a lower layer. In this case, a top surface of each of the gate insulating layer 122, the interlayer insulating layer 123, and the protective layer 124 may not be flat.

The planarization layer 125 is disposed on the protective layer 124. The planarization layer 125 planarizes a top surface of the thin-film transistor TFT. The planarization layer 125 may be made of an organic material to easily provide a planarized surface. For example, the planarization layer 125 may be made of a material selected from poly-imide, benzocyclobutyne-based resin, and acrylate-based resin. However, the present disclosure is not limited thereto. The planarization layer 125 may include a contact hole so that the source electrode S or the drain electrode D of the thin-film transistor TFT may be electrically connected to the organic light-emitting element 130. The planarization layer 125 may extend to the non-display area NDA.

The organic light-emitting element 130 is disposed on the planarization layer 125 in the display area DA. The organic light-emitting element 130 may be disposed to correspond to each of the plurality of subpixels SP. The organic light-emitting element 130 includes an anode 131, an organic light-emitting layer 132, and a cathode 133.

The anode 131 may be disposed on the planarization layer 125. The anodes 131 are separated for each of the plurality of subpixels SP. The anode 131 may be disposed on the planarization layer 125 so as to correspond to a light-emitting area of each of the subpixels SP. The anode 131 may be electrically connected to the source electrode S or the drain electrode D of the thin-film transistor TFT through the contact hole.

The anode 131 may be made of a conductive material having a high work function. For example, the anode 131 may be made of transparent conductive oxides such as indium-tin-oxide (ITO), indium-zinc-oxide (IZO), or indium-tin-zinc-oxide (ITZO). However, the present disclo-sure is not limited thereto. In case that the organic light-emitting element 130 operates in a top light-emitting man-ner, the anode 131 may further include a reflective material to have reflective properties. As necessary, a reflective layer may be separately disposed on a lower portion of the anode 131.

The bank BNK may be disposed on the planarization layer 125 and the anode 131. The bank BNK defines the light-emitting area of the organic light-emitting layer 132. Specifically, the bank BNK may be disposed on the planar-ization layer 125 to expose at least a part of the anode 131. The bank BNK may be disposed on the planarization layer 125 so as to cover an end of the anode 131. The bank BNK may extend to the non-display area NDA.

The organic light-emitting layer 132 is disposed on the anode 131. The organic light-emitting layer 132 includes a light-emitting material and emits light. The organic light-emitting layer 132 may be formed as a single layer without being separated for each of the plurality of subpixels SP. The organic light-emitting layer 132 may be disposed in the display area DA so as to cover the anode 131 and the bank BNK. However, the present disclosure is not limited thereto. In accordance with operation methods or design, the organic light-emitting layers 132 may be separated for each of the plurality of subpixels. Specifically, the organic light-emit-ting layer 132 may be disposed on the anode 131 exposed without being covered by the bank BNK.

The surface of the anode 131 may be treated by being irradiated with plasma to reduce interfacial resistance and increase a bonding force between the anode 131 and the organic light-emitting layer 132 before the organic light-emitting layer 132 is formed on the anode 131.

The cathode 133 is disposed on the organic light-emitting layer 132. The cathode 133 may be formed as a single layer without being separated for each of the plurality of subpixels SP. The cathode 133 may be made of a transparent conduc-tive oxide or a metallic material having a low work function. In case that the cathode 133 is made of a metallic material, the cathode 133 has a very small thickness, and thus is substantially transparent. For example, the cathode 133 may be made of a metallic material selected from calcium (Ca), barium (Ba), aluminum (Al), silver (Ag), and an alloy containing one or more of the above-mentioned elements. However, the present disclosure is not limited thereto.

The sealing layer 140 is disposed to cover the organic light-emitting element 130. The sealing layer 140 blocks moisture or oxygen introduced from the outside and sup-presses oxidation and degradation of the organic light-emitting element 130. The sealing layer 140 may be con-figured as a single layer or a multilayer, as necessary. For example, the sealing layer 140 may be configured as a multilayer including an inorganic sealing layer made of an inorganic material, and an organic sealing layer made of an organic material. The sealing layer 140 may be disposed to extend to the non-display area NDA.

The sealing substrate 160 is disposed on the sealing layer 140 so as to face the substrate 110. The sealing substrate 160 protects the organic light-emitting element 130 from exter-nal impact and suppresses penetration of foreign materials, moisture, oxygen, and the like.

The bonding layer 150 is disposed between the sealing substrate 160 and the sealing layer 140. The bonding layer 150 joins the substrate 110 and the sealing substrate 160 while filling a space between the sealing layer 140 and the sealing substrate 160. The bonding layer 150 may include bondable resin. The bonding layer 150 may further include a hygroscopic filler selectively, as necessary. The bondable resin may have bondability and be made of a transparent material so that light extraction efficiency is not degraded. The hygroscopic filler may absorb oxygen or moisture and delay oxidation and degradation of the organic light-emit-ting element 130. The bonding layer 150 may be disposed to extend to the non-display area NDA.

Figure 4:
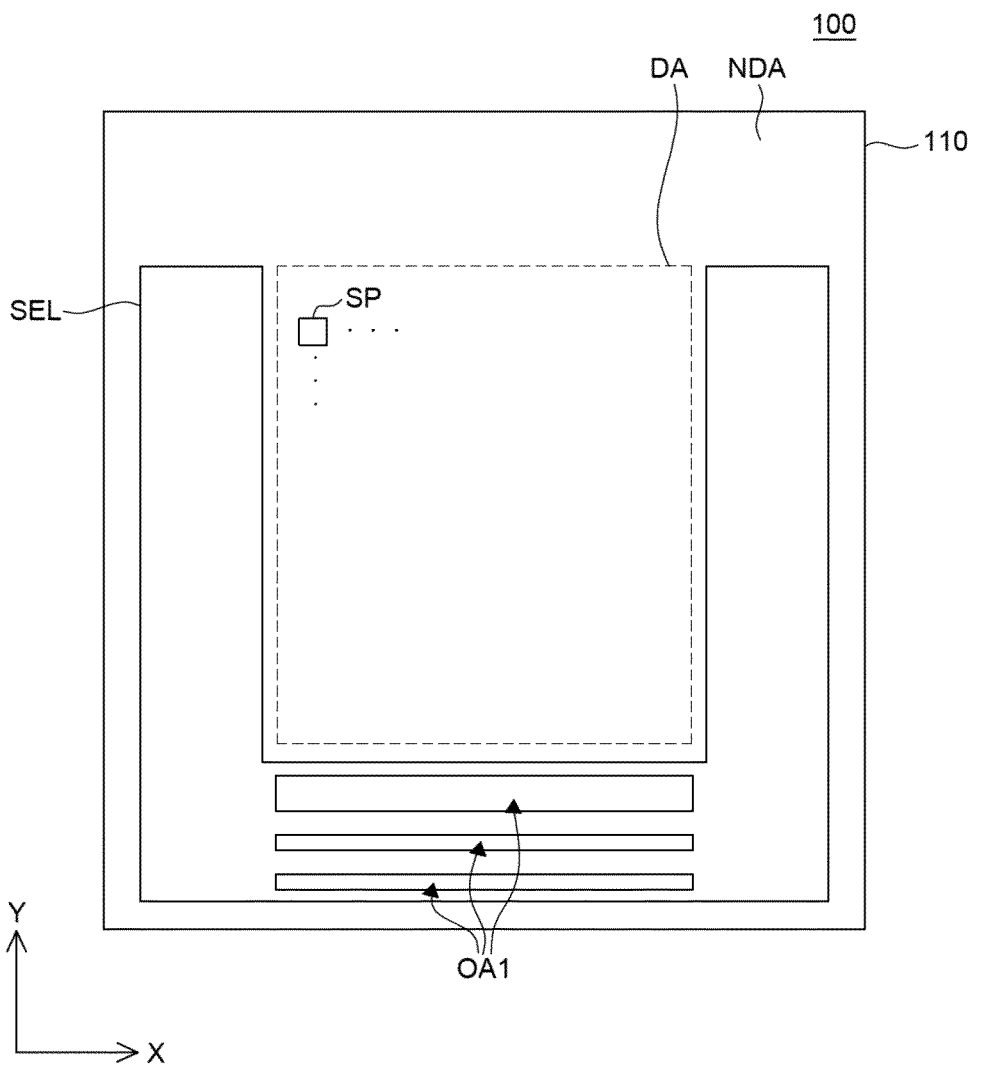
FIG. 4 is a top plan view for explaining a sub-electrode layer disposed in a non-display area of the display device according to the exemplary embodiment of the present disclosure.
Figure 5:
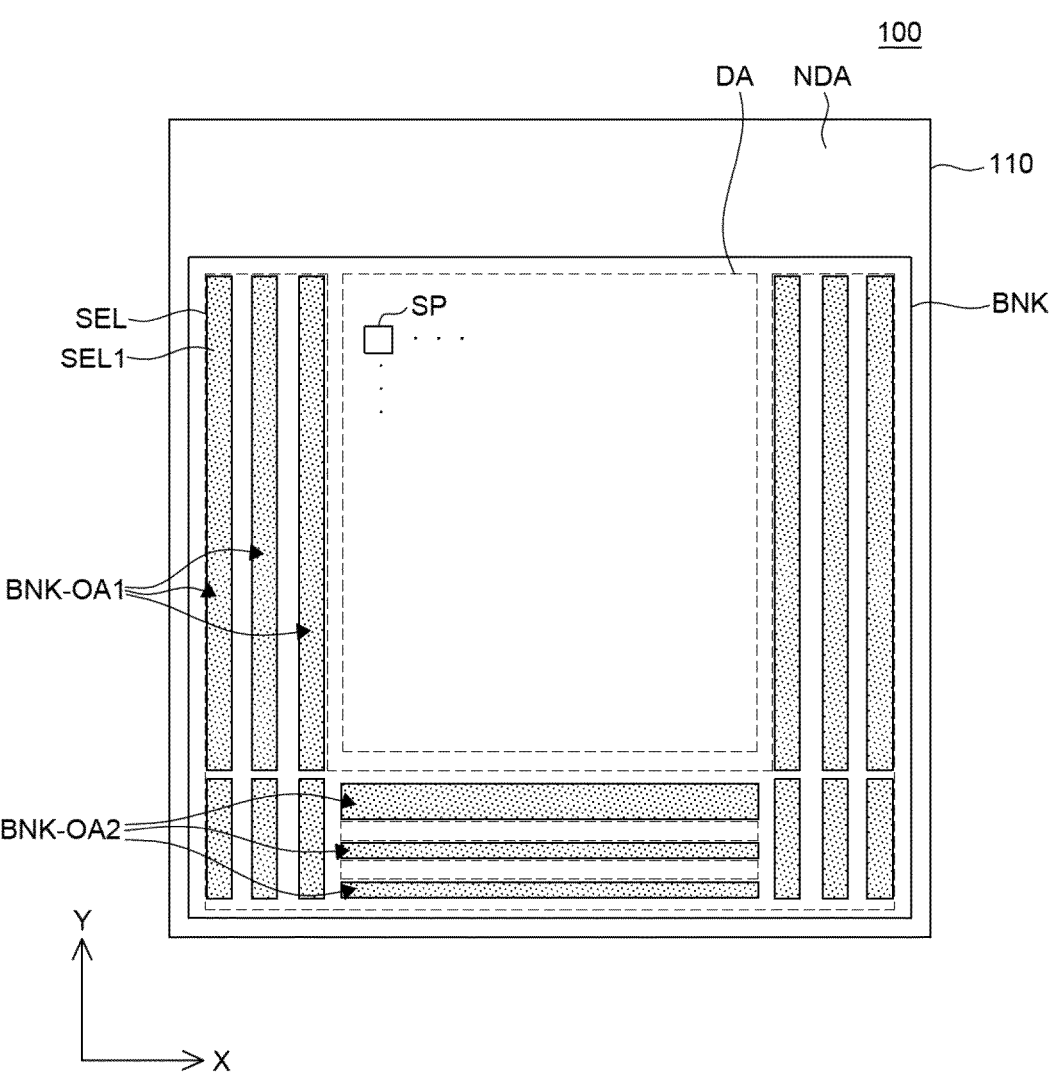
FIG. 5 is a top plan view for explaining the sub-electrode layer and a bank disposed in the non-display area of the display device according to the exemplary embodiment of the present disclosure.

Hereinafter, the constituent elements disposed in the non-display area NDA will be described in detail with reference to FIGS. 1 to 5. FIG. 4 is a top plan view for explaining a sub-electrode layer disposed in the non-display area of the display device according to the exemplary embodiment of the present disclosure, and FIG. 5 is a top plan view for explaining the sub-electrode layer and the bank disposed in the non-display area of the display device according to the exemplary embodiment of the present disclosure. The remaining constituent elements excluding the substrate 110 and the sub-electrode layer SEL are omitted from FIG. 4, and the remaining constituent elements excluding the substrate 110, the sub-electrode layer SEL, and the bank BNK are omitted from FIG. 5.

The gate drive part GIP is disposed in the non-display area NDA on the substrate 110. The gate drive part GIP includes a plurality of gate drive lines CL.

The buffer layer 121 and the gate insulating layer 122 may each extend to the non-display area NDA. The plurality of gate drive lines CL may be disposed on the gate insulating layer 122. However, the present disclosure is not limited thereto. The position of the gate drive line CL may be changed in accordance with operation methods or design. The plurality of gate drive lines CL may be made of the same electrode material and made by the same process as the gate electrode G. However, the present disclosure is not limited thereto. For example, the plurality of gate drive lines CL may each be a clock signal line, a start signal line, or the like.

The interlayer insulating layer 123 extends to the non-display area NDA and is disposed to cover the gate drive line CL.

The gate drive part GIP may further include a gate drive circuit connected to the gate line GL connected to each of the plurality of subpixels SP disposed in the display area DA.

The ground line GND is disposed in the non-display area NDA on the substrate 110. The ground line GND may be disposed on the buffer layer 121. However, the present disclosure is not limited thereto. The position of the ground line GND may be changed in accordance with operation methods or design. The ground line GND is disposed to cover the gate insulating layer 122.

The protective layer 124 may be disposed to extend to the non-display area NDA so as to cover the gate drive part GIP and the ground line GND.

The planarization layer 125 extends to the non-display area NDA and is disposed on the protective layer 124. In the non-display area NDA, the planarization layer 125 planarizes a top surface of the gate drive part GIP.

In the non-display area NDA, the sub-electrode layer SEL is disposed on the planarization layer 125. The sub-electrode layer SEL may be disposed on the three sides of the non-display area NDA. The sub-electrode layer SEL may be disposed along the first side, the second side, and the fourth side of the non-display area NDA. Specifically, the sub-electrode layer SEL may be disposed to be elongated in the first direction (Y-axis direction) along the first and second sides of the non-display area NDA and elongated in the second direction (X-axis direction) along the fourth side. The sub-electrode layer SEL, which is disposed along the first side, the fourth side, and the second side of the non-display area NDA, may be integrally formed. However, the present disclosure is not limited thereto. The sub-electrode layer SEL may be disposed to have structures separated for the first side, the second side, and the fourth side, respectively.

The sub-electrode layer SEL serves to suppress or delay penetration of oxygen into the display area DA from the outside. Therefore, to ensure reliability, the sub-electrode layer SEL is disposed in an area that has a relatively small width and is more vulnerable to oxygen introduced from the outside. In addition, various types of connection lines, various pad parts, power lines, and the like are disposed on the third side, and various constituent elements including the connection lines, the various pad parts, and the power lines are disposed to be connected to the printed circuit board. In case that the sub-electrode layer SEL is disposed in the area corresponding to the third side, it is relatively highly likely that interference or a short circuit may occur between the circuits. FIG. 4 illustrates that the sub-electrode layer SEL is disposed along the first side, the second side, and the fourth side of the non-display area NDA having a relatively small width, and the sub-electrode layer SEL is not disposed on the third side on which the circuit interference or the short circuit may occur. However, the present disclosure is not limited thereto. The sub-electrode layer SEL may be disposed on the four sides of the non-display area NDA. The area in which the sub-electrode layer SEL is disposed may be changed as necessary or in accordance with design.

The sub-electrode layer SEL includes a first area SEL1 and a second area SEL2. The first area SEL1 may overlap bank opening portions BNK-OA1 and BNK-OA2 to be described below. The second area SEL2 may be the remaining area excluding the first area SEL1. The first area SEL1 may include oxygen vacancies. That is, the first area SEL1 is in a state in which oxygen is relatively deficient in comparison with the second area SEL2. Therefore, in the first area SEL1, oxygen introduced from the outside is easily adsorbed. Therefore, when oxygen is introduced into the non-display area NDA from the outside, the oxygen is adsorbed by the oxygen vacancies in the first area SEL1, which suppresses the introduction of oxygen into the display area DA or decreases an introduction speed of oxygen. Therefore, it is possible to suppress oxidation of the cathode 133 caused by oxygen introduced from the outside, thereby improving reliability of the display device 100.

With reference to FIG. 3, the first area SEL1 may be formed only on a surface portion of the sub-electrode layer SEL that overlaps the bank opening portion BNK-OA1. That is, the first area SEL1 may have a predetermined depth from a surface of the sub-electrode layer SEL that overlaps the bank opening portion BNK-OA1. Therefore, a thickness of the first area SEL1 may be smaller than a thickness of the sub-electrode layer SEL. However, the present disclosure is not limited thereto. As another example, the first area SEL1 may be formed not only over the surface portion of the sub-electrode layer SEL, which overlaps the bank opening portions BNK-OA1 and BNK-OA2, but also over the overall thickness to the lower portion that is in contact with the planarization layer 125.

The first area SEL1 of the sub-electrode layer SEL includes the oxygen vacancies and has lower resistance characteristics than the second area SEL2. That is, surface resistance of the first area SEL1 of the sub-electrode layer SEL is lower than surface resistance of the second area SEL2. The first area SEL1 of the sub-electrode layer SEL is treated with plasma and includes the oxygen vacancies. This configuration will be described below.

The sub-electrode layer SEL may include an opening portion through which at least a part of the planarization layer 125 is exposed. For example, the sub-electrode layer SEL includes at least one first opening portion OA1 through which at least a part of the planarization layer 125 corresponding to the fourth side is exposed. The first opening portion OA1 may be elongated in the second direction (X-axis direction) along the fourth side. As described above, the first opening portion OA1 inhibits oxygen (by way of first area SEL1 being oxygen deficient), which is introduced from the outside, from being introduced inward toward the display area DA and further decreases an introduction speed. In addition, the first opening portion OA1 may serve as a contact hole for electrically connecting different lines. Specifically, when a contact hole is formed through the planarization layer 125 exposed by the first opening portion OA1, the lines disposed at the lower side may be electrically connected to other lines or the drive circuit.

The sub-electrode layer SEL may be made of the same material and made by the same process as the anode 131. This will be described below.

The bank BNK may extend to the non-display area NDA and be disposed on the planarization layer 125 and the sub-electrode layer SEL of the non-display area NDA. Specifically, the bank BNK is disposed on the sub-electrode layer SEL formed along the first side, the fourth side, and the second side of the non-display area NDA. In the present exemplary embodiment, the sub-electrode layer SEL is not disposed on the third side. The bank BNK may be disposed on the planarization layer 125 on the third side of the non-display area NDA.

The sub-electrode layer SEL may include the at least one first opening portion OA1. The bank BNK may be disposed on the planarization layer 125 exposed by the first opening portion OA1. That is, the bank BNK may be disposed to fill the first opening portion OA1.

The bank BNK includes at least one bank opening portion through which at least a part of the sub-electrode layer SEL is exposed. The bank opening portion includes at least one first bank opening portion BNK-OA1 and at least one second bank opening portion BNK-OA2. The first bank opening portion BNK-OA1 exposes at least a part of the sub-electrode layer SEL elongated in the first direction (Y-axis direction) along the first and second sides of the non-display area NDA. The first bank opening portion BNK-OA1 may be elongated in the first direction (Y-axis direction). The second bank opening portion BNK-OA2 exposes at least a part of the sub-electrode layer SEL elongated in the second direction (X-axis direction) along the fourth side of the non-display area NDA. The second bank opening portion BNK-OA2 may be elongated in the second direction (X-axis direction).

FIG. 3 illustrates that three first bank opening portions BNK-OA1 are provided. However, the present disclosure is not limited thereto. As necessary or in accordance with design and structures, the first bank opening portion BNK-OA1 may change in number or width.

As described above, the first area SEL1 of the sub-electrode layer SEL overlaps the bank opening portions BNK-OA1 and BNK-OA2, and the first area SEL1 includes the oxygen vacancies. That is, the at least one first bank opening portion BNK-OA1 and the at least one second bank opening portion BNK-OA2 may each overlap the first area SEL1 of the sub-electrode layer SEL. The oxygen vacancies of the first area SEL1 may be formed by irradiating plasma to the sub-electrode layer SEL exposed by the at least one first bank opening portion BNK-OA1 and the at least one second bank opening portion BNK-OA2.

Hereinafter, a process of forming the first area SEL1 including the oxygen vacancies in the sub-electrode layer SEL will be described in detail.

The process of forming the first area SEL1 including the oxygen vacancies in the sub-electrode layer SEL may include a first process of forming the sub-electrode layer SEL, a second process of forming the bank BNK including the bank opening portions BNK-OA1 and BNK-OA2 on the sub-electrode layer SEL, and a third process of irradiating plasma onto the sub-electrode layer SEL exposed by the bank opening portions BNK-OA1 and BNK-OA2. The first process may be performed as a process identical to the process of forming the anode 131 in the display area DA. The second process may be performed as a process identical to the process of forming the bank BNK on the anode 131 and the planarization layer 125 in the display area DA to expose at least a part of the anode 131. The third process may be performed as a process identical to the process of performing the surface treatment by irradiating plasma to the anode 131 before forming the organic light-emitting layer 132 on the anode 131. That is, the process of forming the first area SEL1 including the oxygen vacancies in the sub-electrode layer SEL is not an additional process but is performed in the same way as a process step of the process of manufacturing the display device 100 in the related art. Therefore, the exemplary embodiment of the present disclosure provides an effect of improving reliability of the display device 100 by suppressing introduction of oxygen from the outside or delaying penetration of oxygen into the display area DA without degrading the process efficiency.

Hereinafter, each of the processes will be specifically described.

The first process is a step of forming the sub-electrode layer SEL. Specifically, the sub-electrode layer SEL is formed by depositing an electrode material on the planarization layer 125 disposed in the non-display area NDA. For example, the electrode material may be selected from transparent conductive oxides such as indium-tin-oxide (ITO), indium-zinc-oxide (IZO), and indium-tin-zinc-oxide (ITZO). However, the present disclosure is not limited thereto. The process of forming the sub-electrode layer SEL may be performed as a process identical to the process of forming the anode 131 on the planarization layer 125 in the display area DA. Therefore, the sub-electrode layer SEL may be made of the same material as the anode 131.

The second process is a step of forming the bank BNK including the bank opening portions BNK-OA1 and BNK-OA2 on the sub-electrode layer SEL. The second process may be performed as a process identical to the process of forming the bank BNK on the anode 131 and the planarization layer 125 in the display area DA to expose at least a part of the anode 131. Specifically, after a bank material is stacked on a front surface including the display area DA and the non-display area NDA, the bank opening portions BNK-OA1 and BNK-OA2 may be formed by means of a photolithography process so that at least a part of the anode 131 is exposed in the display area DA, and at least a part of the sub-electrode layer SEL is exposed in the non-display area NDA. Therefore, the bank BNK disposed in the display area DA and the bank BNK disposed in the non-display area NDA may be made of the same material.

The third process is a step of irradiating plasma onto the sub-electrode layer SEL exposed by the bank opening portions BNK-OA1 and BNK-OA2. The third process may be performed as a process identical to the process of performing the surface treatment by irradiating plasma to the anode 131 before forming the organic light-emitting layer 132 on the anode 131. Specifically, plasma is irradiated to the anode 131 of the display area DA, which is exposed without being covered by the bank BNK, and the sub-electrode layer SEL exposed by the bank opening portions BNK-OA1 and BNK-OA2. The oxygen vacancies are formed in the surface portions of the anode 131 and the sub-electrode layer SEL irradiated with the plasma. The oxygen vacancies are formed in the surface portion as the plasma is applied to surfaces of the anode 131 and the sub-electrode layer SEL, such that the first area SEL1 of the sub-electrode layer SEL including the oxygen vacancies is formed in the vicinity of the surface portion irradiated with the plasma. Therefore, the sub-electrode layer SEL irradiated with the plasma is divided into the first area SEL1, which is the surface portion having the oxygen vacancies, and the second area SEL2 which is the remaining area. However, the present disclosure is not limited thereto. In accordance with a process condition during an operation of irradiating plasma, the oxygen vacancies may be formed over the lower portion of the sub-electrode layer SEL on the surface portion of the sub-electrode layer SEL irradiated with the plasma.

The first area SEL1 and the second area SEL2 may have different physical properties because of a difference in concentration of the oxygen vacancies. For example, surface resistance of the first area SEL1 of the sub-electrode layer SEL is lower than surface resistance of the second area SEL2.

The plasma may be selected from argon (Ar) plasma and argon/oxygen (Ar/O$_2$) plasma. The argon (Ar) plasma and the argon/oxygen (Ar/O$_2$) plasma may form the oxygen vacancies in the surface of the sub-electrode layer SEL. In case that the argon/oxygen (Ar/O$_2$) plasma is used, a flow ratio of argon (Ar) to oxygen ($O_2$) may be 7:3 to 9.9:0.1 or 7:3 to 9:1. Within this range, the high interface characteristics between the anode 131 and the organic light-emitting layer 132 may be maintained, and the oxygen vacancies having a sufficient concentration are formed in the sub-electrode layer SEL, thereby improving reliability. In case that the flow ratio of oxygen is relatively high when the argon/oxygen (Ar/$O_2$) plasma is used, the oxygen vacancies having a sufficient concentration may not be formed. For this reason, the effect of improving reliability is insufficient.

As necessary or in accordance with design and structures, the organic light-emitting layer 132 and the cathode 133 of the organic light-emitting element 130 may be disposed to extend to the non-display area NDA. For example, the organic light-emitting layer 132 may be disposed to extend to the non-display area NDA so as to cover at least a part of the sub-electrode layer SEL exposed by the bank opening portions BNK-OA1 and BNK-OA2 in the non-display area NDA. For example, the cathode 133 may be disposed to cover the organic light-emitting layer 132 disposed to extend to the non-display area NDA. The cathode 133 may be disposed to further extend than the organic light-emitting layer 132, and the end of the extended cathode 133 may be disposed to be in direct contact with the sub-electrode layer SEL. This reduces the introduction of moisture and/or oxygen to the display area DA and aids the protection of lower layers.

The display device 100 according to the exemplary embodiment of the present disclosure includes the sub-electrode layer SEL disposed along the three sides of the non-display area NDA. The first area SEL1 of the sub-electrode layer SEL includes the oxygen vacancies. Therefore, when oxygen is introduced from the outside, the oxygen may be easily adsorbed in the first area SEL1 of the sub-electrode layer SEL, which suppresses the introduction of oxygen into the display area DA and decreases the introduction speed. Therefore, the display device 100 according to the exemplary embodiment of the present disclosure may suppress oxidation of the cathode 133 caused by oxygen and minimize degradation of the subpixel SP, thereby providing the effect of improving reliability. In addition, the sub-electrode layer SEL may be made of the same material and made by the same process as the anode 131. Therefore, the number of process steps or costs are not greatly increased.

Figure 6:
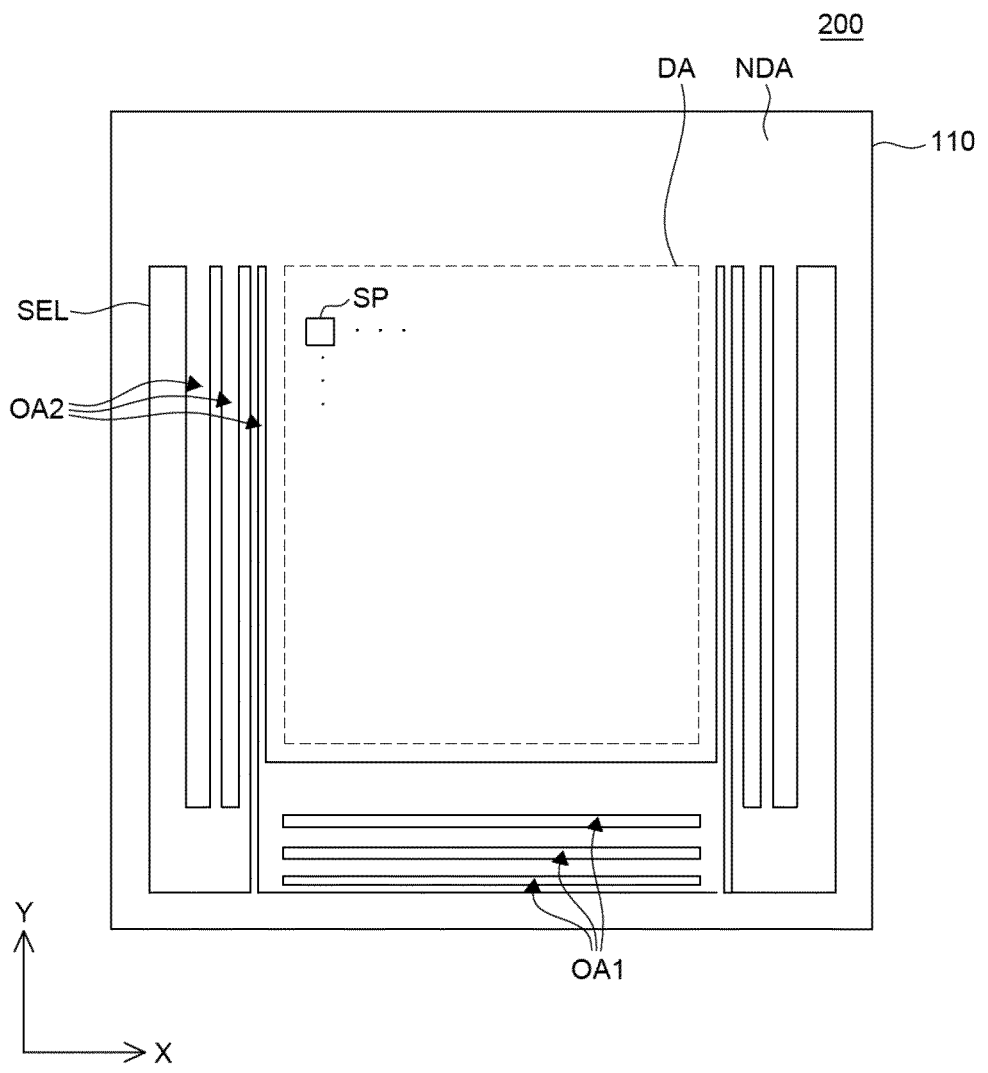
FIG. 6 is a top plan view for explaining a sub-electrode layer disposed in a non-display area of a display device according to another exemplary embodiment of the present disclosure.
Figure 7:
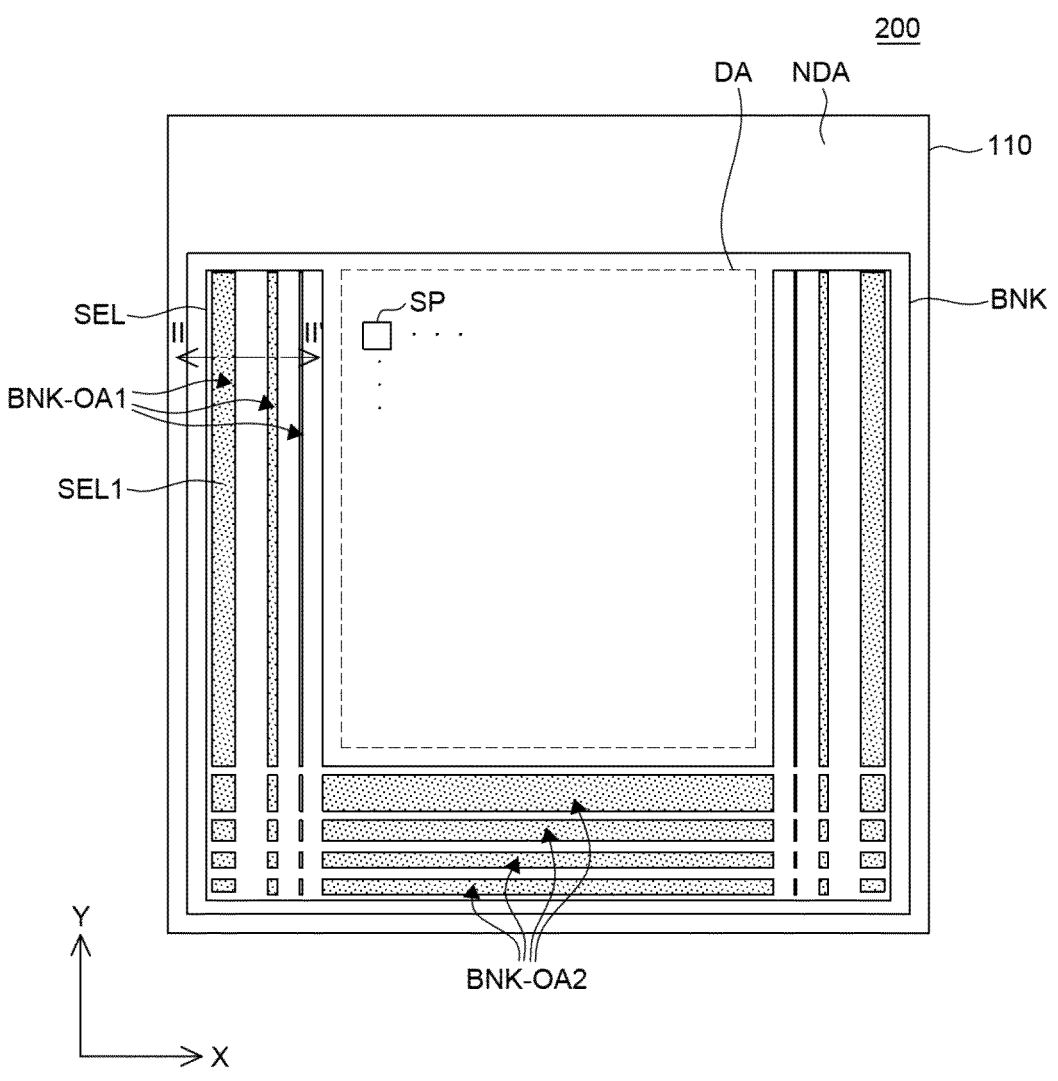
FIG. 7 is a top plan view for explaining the sub-electrode layer and a bank disposed in the non-display area of the display device according to another exemplary embodiment of the present disclosure.
Figure 8:
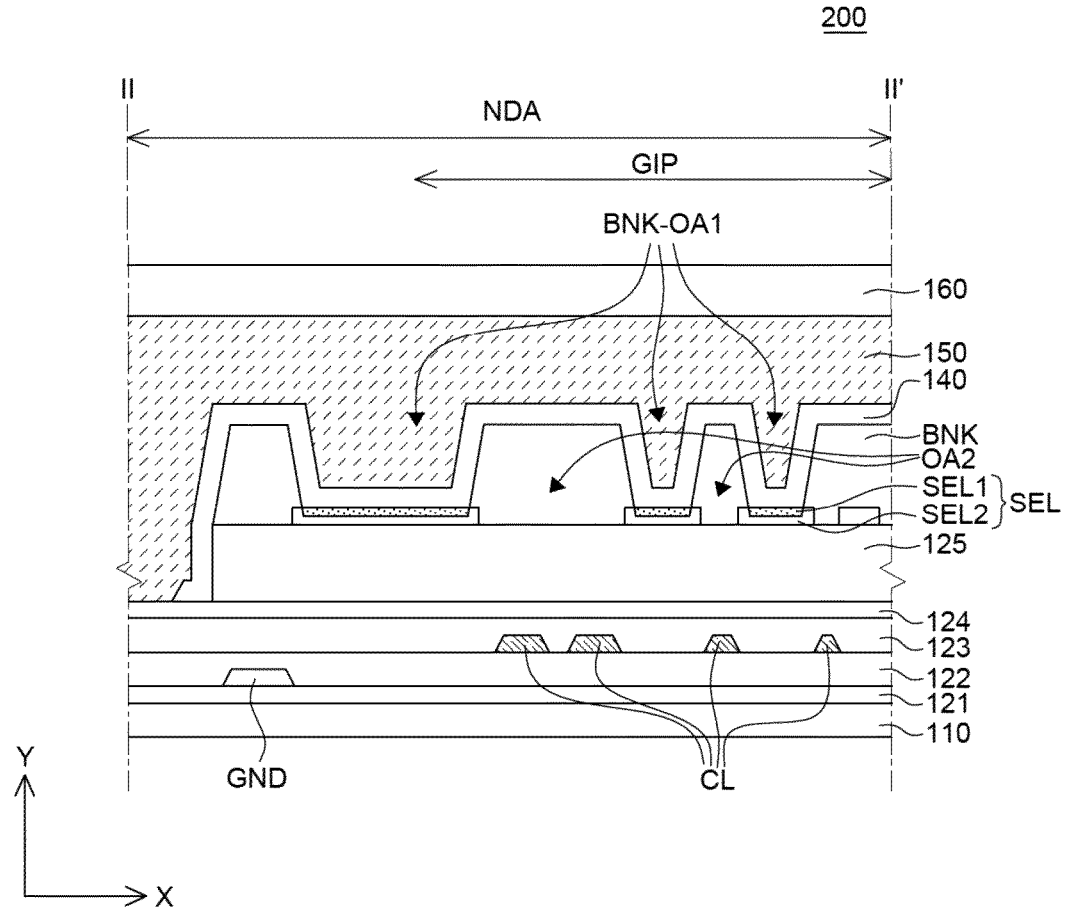
FIG. 8 is a cross-sectional view taken along line II-II' in FIG. 7.

FIGS. 6 to 8 are views for explaining a display device according to another exemplary embodiment of the present disclosure. Hereinafter, the display device according to another exemplary embodiment of the present disclosure will be described with reference to FIGS. 6 and 8.

FIG. 6 is a top plan view for explaining a sub-electrode layer disposed in a non-display area of a display device according to another exemplary embodiment of the present disclosure, FIG. 7 is a top plan view for explaining the sub-electrode layer and a bank disposed in the non-display area of the display device according to another exemplary embodiment of the present disclosure, and FIG. 8 is a cross-sectional view taken along line II-II' in FIG. 7. The remaining constituent elements excluding the substrate and the sub-electrode layer are omitted from FIG. 6, and the remaining constituent elements excluding the substrate, the sub-electrode layer, and the bank are omitted from FIG. 7. A display device 200 according to another exemplary embodiment of the present disclosure is substantially identical to the display device 100 illustrated in FIGS. 1 to 5, except for structures of the sub-electrode layer and the bank. Therefore, a repeated description will be omitted.

In the display device 200 illustrated in FIGS. 6 to 8, the sub-electrode layer SEL includes a plurality of second opening portions OA2. The second opening portions OA2 each exposes at least a part of the planarization layer 125 corresponding to the first and second sides. The second opening portions OA2 are each elongated in the first direction (Y-axis direction) along the first and second sides. As described above, the second opening portion OA2 inhibits oxygen, which is introduced from the outside, from being introduced inward toward the display area DA and further decreases the introduction speed.

The plurality of second opening portions OA2 may overlap at least some of the plurality of gate drive lines CL. Therefore, the second opening portion OA2 may serve as a contact hole for electrically connecting different lines. Specifically, when a contact hole is formed through the planarization layer 125 exposed by the second opening portion OA2, the lines disposed at the lower side may be electrically connected to other lines or the drive circuit.

At least one of the plurality of second opening portions OA2 may extend in the first direction (Y-axis direction) and are formed through the sub-electrode layer SEL. In this case, the sub-electrode layer SEL may be used as various lines such as auxiliary lines or connection lines.

The bank BNK may be disposed on an upper portion of the sub-electrode layer SEL formed along the first side, the fourth side, and the second side of the non-display area NDA, and the bank BNK may be disposed on an upper portion of the planarization layer 125 disposed on the third side. The bank BNK may be disposed on the planarization layer 125 exposed by the first opening portion OA1 and the second opening portion OA2 so as to fill the first opening portion OA1 and the second opening portion OA2.

The bank BNK includes a plurality of first bank opening portions BNK-OA1 and a plurality of second bank opening portions BNK-OA2 through which at least a part of the sub-electrode layer SEL is exposed. The first bank opening portion BNK-OA1 exposes at least a part of the sub-electrode layer SEL elongated in the first direction (Y-axis direction) along the first and second sides of the non-display area NDA. The second bank opening portion BNK-OA2 exposes at least a part of the sub-electrode layer SEL elongated in the second direction (X-axis direction) along the fourth side of the non-display area NDA.

The sub-electrode layer SEL includes the first area SEL1 that overlaps the plurality of first bank opening portions BNK-OA1 and the plurality of second bank opening portions BNK-OA2. The first area SEL1 includes the oxygen vacancies. As described above, the bank BNK is stacked, and then the surface treatment is performed by irradiating plasma to the sub-electrode layer SEL exposed by the plurality of first bank opening portions BNK-OA1 and the plurality of second bank opening portions BNK-OA2. The surface portion of the sub-electrode layer SEL irradiated with the plasma includes the oxygen vacancies.

The first area SEL1 including the oxygen vacancies is in a state in which oxygen is relatively deficient in comparison with the second area SEL2. Therefore, when oxygen is introduced into the non-display area NDA from the outside, the oxygen is easily adsorbed in the first area SEL1, which suppresses and delays the introduction of oxygen into the display area DA.

The display device 200 according to another exemplary embodiment of the present disclosure includes the sub-electrode layer SEL disposed along the three sides of the non-display area NDA. The sub-electrode layer SEL includes the first area SEL1 including the oxygen vacancies.

Therefore, oxygen is adsorbed, which suppresses the introduction of oxygen into the display area DA and decreases the introduction speed. Therefore, the oxidation of the cathode 133 caused by oxygen is suppressed, and the degradation of the subpixel SP is minimized, thereby providing the effect of improving reliability. In addition, the sub-electrode layer SEL may be elongated in the first direction (Y-axis direction) or include the plurality of second opening portions OA2 extended to be formed through the sub-electrode layer SEL in the first direction (Y-axis direction), such that the sub-electrode layer SEL may be used as lines such as auxiliary lines or connection lines.

Figure 9:
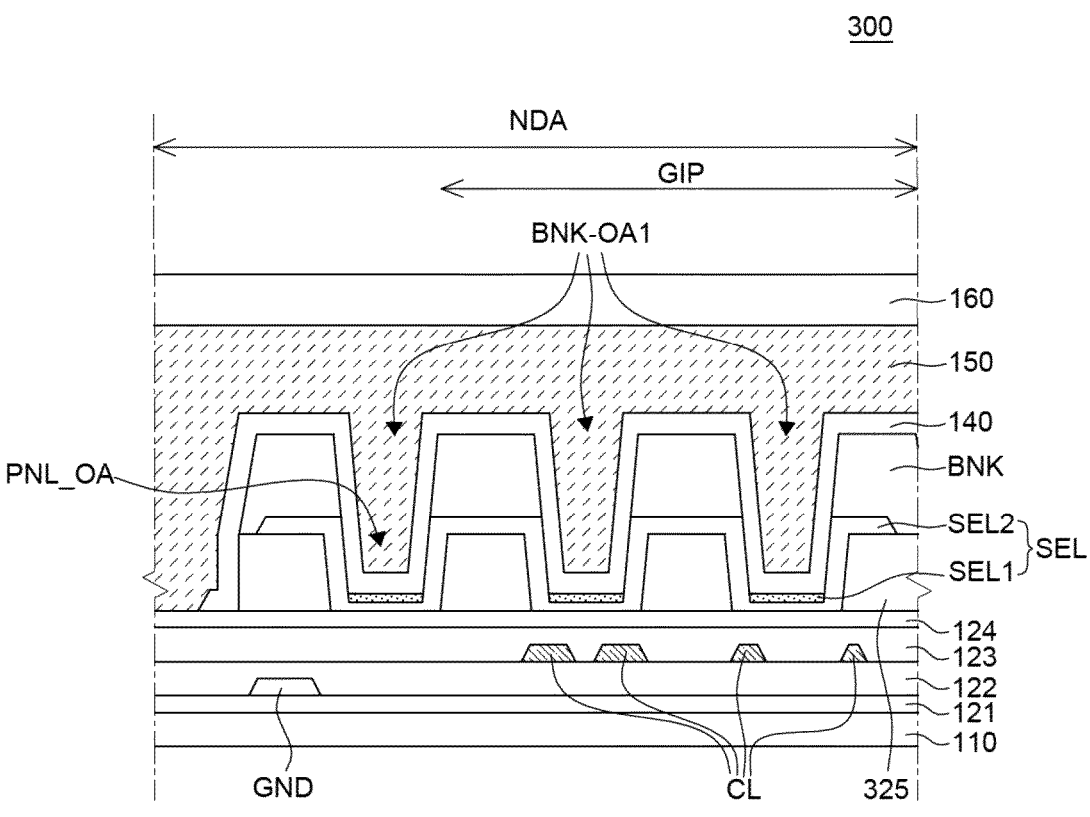
FIG. 9 is a cross-sectional view illustrating a non-display area of a display device according to still another exemplary embodiment of the present disclosure.

FIG. 9 is a cross-sectional view illustrating a non-display area of a display device according to still another exemplary embodiment of the present disclosure. A display device 300 illustrated in FIG. 9 is substantially identical to the display device 100 illustrated in FIGS. 1 to 5, except that a planarization layer opening portion is provided in the planarization layer, and thus there are some differences in arrangement structures of the sub-electrode layers and the protective layers. Therefore, a repeated description of the identical constituent elements will be omitted.

With reference to FIG. 9, a planarization layer 325 includes a plurality of planarization layer opening portions PNL_OA. The planarization layer opening portion PNL_OA is formed through the planarization layer 325 in the thickness direction so as to expose at least a part of the protective layer 124 disposed below the planarization layer opening portion PNL_OA.

The sub-electrode layer SEL is disposed to cover the planarization layer 325 and an upper portion of the protective layer 124 exposed by the planarization layer opening portion PNL_OA.

The bank BNK is disposed on the sub-electrode layer SEL. In the non-display area NDA, the bank BNK includes a plurality of bank opening portions provided to overlap the planarization layer opening portion PNL_OA. Specifically, in the non-display area NDA in which the gate drive part GIP is disposed, the plurality of planarization layer opening portions PNL_OA may respectively overlap a plurality of bank opening portions BNK-OA1. The plurality of bank opening portions BNK-OA1 each exposes at least a part of the sub-electrode layer SEL. That is, because the planarization layer opening portion PNL_OA and the bank opening portion BNK-OA1 are formed to overlap, the sub-electrode layer SEL disposed on the protective layer 124 exposed by the planarization layer opening portion PNL_OA is exposed without being covered by the bank opening portion BNK-OA1.

The sub-electrode layer SEL includes the first area SEL1 and the second area SEL2. The first area SEL1 overlaps the planarization layer opening portion PNL_OA and the bank opening portion BNK-OA1. The second area SEL2 is the remaining area excluding the first area SEL1. The first area SEL1 is formed by irradiating plasma to the sub-electrode layer SEL exposed by the bank opening portion BNK-OA1. The first area SEL1 includes oxygen vacancies formed by plasma. Therefore, the first area SEL1 is in a state in which oxygen is relatively deficient in comparison with the second area SEL2. Therefore, in the first area SEL1, oxygen introduced from the outside is easily adsorbed. Therefore, when oxygen is introduced into the non-display area NDA from the outside, the oxygen is adsorbed by the oxygen vacancies in the first area SEL1, which suppresses the introduction of oxygen into the display area or decreases the introduction speed of oxygen.

According to the present exemplary embodiment, the planarization layer 325 includes the planarization layer opening portion PNL_OA corresponding to the bank opening portion BNK-OA1. The first area SEL1 of the sub-electrode layer SEL including the oxygen vacancies is positioned on the protective layer 124 corresponding to the planarization layer opening portion PNL_OA. Therefore, when oxygen is introduced from the outside of the display device 300, the oxygen is adsorbed by the oxygen vacancies, which may effectively suppress the introduction of oxygen into the display area. In addition, because the planarization layer 325 is discontinuously formed on the planarization layer opening portion PNL_OA, it is possible to block a route through which oxygen or moisture introduced from the outside is introduced into the display area through the planarization layer 325 made of an organic material.

The sealing layer 140 may be disposed to cover the sub-electrode layer SEL and the bank BNK exposed by the bank opening portion BNK-OA1. The sealing layer 140 may be disposed to further extend toward an outer peripheral portion of the non-display area NDA than the bank BNK and the sub-electrode layer SEL. In this case, the sealing layer 140 further blocks the introduction of moisture or oxygen from the outside, which may further improve the reliability of the display device 300.

The exemplary embodiments of the present disclosure can also be described as follows:

According to an aspect of the present disclosure, a display device comprises a substrate having a display area and a non-display area configured to surround the display area, a thin-film transistor disposed on the substrate while corresponding to the display area, a planarization layer disposed to cover the thin-film transistor, an organic light-emitting element disposed on the planarization layer while corresponding to the display area and including an anode electrically connected to the thin-film transistor, an organic light-emitting layer disposed on the anode, and a cathode disposed on the organic light-emitting layer, a sub-electrode layer disposed on the substrate while corresponding to at least a part of the non-display area, and banks disposed on the planarization layer in the display area so as to expose at least a part of the anode and disposed on the sub-electrode layer in the non-display area, wherein the bank includes a plurality of bank opening portions disposed in the non-display area so as to expose at least a part of the sub-electrode layer, and the sub-electrode layer includes oxygen vacancies in an area in which the sub-electrode layer overlaps the plurality of bank opening portions.

The planarization layer may be disposed in the display area and the non-display area, and the sub-electrode layer may be disposed on the planarization layer while corresponding to the at least a part of the non-display area.

The planarization layer may include a plurality of planarization layer opening portions that respectively overlaps the plurality of bank opening portions in the non-display area, the plurality of planarization layer opening portions each may expose at least a part of a protective layer disposed on the substrate, and the sub-electrode layer may be disposed on the planarization layer and the protective layer exposed by the plurality of planarization layer opening portions.

The sub-electrode layer may include the oxygen vacancies in an area in which the sub-electrode layer overlaps the plurality of planarization layer opening portions.

The sub-electrode layer may include a first area which overlaps each of the plurality of bank opening portions, and a second area which is the remaining area excluding the first area.

The first area of the sub-electrode layer may be treated with plasma and may include the oxygen vacancies.

The plasma may be argon (Ar) plasma or argon/oxygen (Ar/O$_2$) plasma.

In the argon/oxygen (Ar/O$_2$) plasma, a flow ratio of argon (Ar) to oxygen (O$_2$) may be 7:3 to 9.9:0.1.

A Surface resistance of the first area may be lower than surface resistance of the second area.

The sub-electrode layer may be made of the same material as the anode.

The non-display area may include first and second sides extending in a first direction and configured to face each other, third and fourth sides extending in a second direction perpendicular to the first direction and configured to face each other, a gate drive part disposed on the substrate while corresponding to at least one of the first and second sides, and a data drive part disposed on the substrate while corresponding to the third side, wherein the planarization layer is disposed to cover the gate drive part, and the sub-electrode layer may be disposed on the planarization layer while corresponding to the at least one of the first and second sides.

The gate drive part may be disposed on the substrate while corresponding to each of the first and second sides, and the sub-electrode layer may be disposed on the planarization layer so as to be elongated along the first and second sides.

The sub-electrode layer may be disposed to surround three sides of an outer periphery of the display area.

The sub-electrode layer may be disposed on the planarization layer while corresponding to at least a part of the fourth side and disposed to be elongated along the fourth side.

The sub-electrode layer may include a plurality of first opening portions configured to expose at least a part of the planarization layer corresponding to the fourth side, and the first opening portion may be elongated in the second direction.

The bank may be disposed to fill the first opening portion.

The sub-electrode layer may include a plurality of second opening portions configured to expose at least a part of the planarization layer corresponding to the first and second sides, and the plurality of second opening portions may be elongated in the first direction.

The gate drive part may include a plurality of gate drive lines, and at least some of the plurality of second opening portions may overlap at least a part of the gate drive line.

At least one of the plurality of second opening portions may extend to be formed through the sub-electrode layer in the first direction.

The bank may be disposed to fill the second opening portion.

The bank opening portions may be include a plurality of first bank opening portions elongated in the first direction and configured to expose at least a part of the sub-electrode layer elongated along the first and second sides, and a plurality of second bank opening portions elongated in the second direction and configured to expose at least a part of the sub-electrode layer elongated along the fourth side, and wherein the sub-electrode layer exposed by the first bank opening portion and the second bank opening portion may include the oxygen vacancies.

The sub-electrode layer may comprise the first area and a second area comprising the remaining area excluding the first area.

The first area of the sub-electrode layer may be relatively oxygen deficient compared to the second area.

The first area of the sub-electrode layer may have a lower surface resistance than the second area of the sub-electrode layer.

The first area of the sub-electrode layer may have a predetermined depth from a surface of the sub-electrode layer.

The first area of the sub-electrode layer may be formed on a surface portion of the sub-electrode layer.

The first area of the sub-electrode layer may form the overall thickness of the sub-electrode layer.

The sub-electrode layer may be disposed to be elongated in a first direction along first and second sides of the display device, and dispose to be elongated in a second direction along a third side of the display device.

The first bank opening portion may expose at least the part of the sub-electrode layer elongated in the first direction and the second bank opening portion may expose at least a part of the sub-electrode layer elongated in the second direction.

The sub-electrode layer may comprise a first sub-electrode opening portion so as to expose at least a part of the planarization layer corresponding to the third side of the display device.

The sub-electrode layer may comprise the second sub-electrode opening portion so as to expose at least a part of the planarization layer corresponding to the first and second sides of the display device.

The bank may be disposed on an upper portion of the planarization layer.

The bank may be disposed on an upper portion of the sub-electrode layer.

The bank may be disposed on the part of the planarization layer exposed by the first and second sub-electrode opening portions so as to fill the first and second sub-electrode openings portions.

The planarization layer may comprise the planarization layer opening portion so as to expose at least a part of a protection layer.

The sub-electrode layer may be disposed to cover the planarization layer and an upper portion of the protective layer exposed by the planarization layer opening portion.

The bank may include a plurality of bank opening portions disposed to overlap the planarization layer opening portion.

The first area of the sub-electrode layer may overlap the planarization layer opening portion and the bank opening portion.

The sub-electrode layer may be made of the same material as the anode.

A sealing layer may be disposed so as to cover the organic light-emitting element.

A bonding layer may be disposed on the sealing layer.

The bonding layer may comprise a bondable resin and/or a hydroscopic filler.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a substrate having a display area and a non-display area configured to surround the display area;

a thin-film transistor disposed on the substrate while corresponding to the display area;

a planarization layer disposed to cover the thin-film transistor;

an organic light-emitting element disposed on the planarization layer while corresponding to the display area and including an anode electrically connected to the thin-film transistor, an organic light-emitting layer disposed on the anode, and a cathode disposed on the organic light-emitting layer;

a sub-electrode layer disposed on the substrate while corresponding to at least a part of the non-display area; and banks disposed on the planarization layer in the display area so as to expose at least a part of the anode and disposed on the sub-electrode layer in the non-display area, wherein the bank includes a plurality of bank opening portions disposed in the non-display area so as to expose at least a part of the sub-electrode layer, and the sub-electrode layer includes oxygen vacancies in an area in which the sub-electrode layer overlaps the plurality of bank opening portions.

2. The display device of claim 1, wherein the planarization layer is disposed in the display area and the non-display area, and the sub-electrode layer is disposed on the planarization layer while corresponding to the at least a part of the non-display area.

3. The display device of claim 2, wherein the planarization layer includes a plurality of planarization layer opening portions that respectively overlaps the plurality of bank opening portions in the non-display area, the plurality of planarization layer opening portions each exposes at least a part of a protective layer disposed on the substrate, and the sub-electrode layer is disposed on the planarization layer and the protective layer exposed by the plurality of planarization layer opening portions.

4. The display device of claim 3, wherein the sub-electrode layer includes the oxygen vacancies in an area in which the sub-electrode layer overlaps the plurality of planarization layer opening portions.

5. The display device of claim 1, wherein the sub-electrode layer includes a first area which overlaps each of the plurality of bank opening portions, and a second area which is the remaining area excluding the first area.

6. The display device of claim 5, wherein the first area of the sub-electrode layer is treated with plasma and includes the oxygen vacancies.

7. The display device of claim 6, wherein the plasma is argon (Ar) plasma or argon/oxygen (Ar/O$_2$) plasma.

8. The display device of claim 7, wherein in the argon/oxygen (Ar/O$_2$) plasma, a flow ratio of argon (Ar) to oxygen (O$_2$) is 7:3 to 9.9:0.1.

9. The display device of claim 5, wherein surface resistance of the first area is lower than surface resistance of the second area.

10. The display device of claim 1, wherein the sub-electrode layer is made of the same material as the anode.

11. The display device of claim 1, wherein the non-display area includes:

first and second sides extending in a first direction and configured to face each other;

third and fourth sides extending in a second direction perpendicular to the first direction and configured to face each other;

a gate drive part disposed on the substrate while corresponding to at least one of the first and second sides; and a data drive part disposed on the substrate while corresponding to the third side, wherein the planarization layer is disposed to cover the gate drive part, and the sub-electrode layer is disposed on the planarization layer while corresponding to the at least one of the first and second sides.

12. The display device of claim 11, wherein the gate drive part is disposed on the substrate while corresponding to each of the first and second sides, and the sub-electrode layer is disposed on the planarization layer so as to be elongated along the first and second sides.

13. The display device of claim 12, wherein the sub-electrode layer is disposed to surround three sides of an outer periphery of the display area.

14. The display device of claim 13, wherein the sub-electrode layer is disposed on the planarization layer while corresponding to at least a part of the fourth side and disposed to be elongated along the fourth side.

15. The display device of claim 14, wherein the sub-electrode layer includes a plurality of first opening portions configured to expose at least a part of the planarization layer corresponding to the fourth side, and the first opening portion is elongated in the second direction.

16. The display device of claim 15, wherein the bank is disposed to fill the first opening portion.

17. The display device of claim 14, wherein the sub-electrode layer includes a plurality of second opening portions configured to expose at least a part of the planarization layer corresponding to the first and second sides, and the plurality of second opening portions is elongated in the first direction.

18. The display device of claim 17, wherein the gate drive part includes a plurality of gate drive lines, and at least some of the plurality of second opening portions overlaps at least a part of the gate drive line.

19. The display device of claim 17, wherein at least one of the plurality of second opening portions extends to be formed through the sub-electrode layer in the first direction.

20. The display device of claim 17, wherein the bank is disposed to fill the second opening portion.

21. The display device of claim 14, wherein the bank opening portions includes:

a plurality of first bank opening portions elongated in the first direction and configured to expose at least a part of the sub-electrode layer elongated along the first and second sides; and a plurality of second bank opening portions elongated in the second direction and configured to expose at least a part of the sub-electrode layer elongated along the fourth side, and wherein the sub-electrode layer exposed by the first bank opening portion and the second bank opening portion includes the oxygen vacancies.

* * * * *